United States Patent
Haramoto et al.

(10) Patent No.: US 7,742,112 B2
(45) Date of Patent: Jun. 22, 2010

(54) MEMORY DEVICE, DATA RECORDING METHOD, AND IC TAG

(75) Inventors: Yuichiro Haramoto, Yamanashi (JP); Takamasa Kato, Yamanashi (JP); Kohki Hiroshima, Yamanashi (JP)

(73) Assignees: Yamanashi University, Kofu-shi (JP); Nippon Chemical Industrial Co., Ltd., Tokyo (JP)

( * ) Notice: Subject to any disclaimer, the term of this patent is extended or adjusted under 35 U.S.C. 154(b) by 260 days.

(21) Appl. No.: 12/123,750

(22) Filed: May 20, 2008

(65) Prior Publication Data

US 2008/0291346 A1    Nov. 27, 2008

(30) Foreign Application Priority Data

May 23, 2007    (JP)    ............................... 2007-137256

(51) Int. Cl.
- G02F 1/13    (2006.01)
- G02F 1/133    (2006.01)
- C09K 19/02    (2006.01)

(52) U.S. Cl. .............................. 349/1; 349/21; 349/184

(58) Field of Classification Search ...................... 349/1, 349/20, 21, 171, 184
See application file for complete search history.

(56) References Cited

U.S. PATENT DOCUMENTS

| | | | | | |
|---|---|---|---|---|---|
| 5,847,786 | A | * | 12/1998 | Shimada et al. | ............... 349/86 |
| 5,933,201 | A | * | 8/1999 | Okabe | .......................... 349/25 |
| 2006/0255318 | A1 | | 11/2006 | Haramoto | |
| 2006/0278848 | A1 | | 12/2006 | Haramoto | |

FOREIGN PATENT DOCUMENTS

| | | |
|---|---|---|
| JP | 2004-006271 A | 1/2004 |
| JP | 2004-311182 A | 11/2004 |
| JP | 2005-142233 A | 6/2005 |
| JP | 2006-342318 A | 12/2006 |

\* cited by examiner

*Primary Examiner*—David Nelms
*Assistant Examiner*—David Y Chung
(74) *Attorney, Agent, or Firm*—Westerman, Hattori, Daniels & Adrian, LLP

(57) ABSTRACT

A memory device includes first electrodes, second electrodes, third electrodes, heaters, and memory cells between the first electrodes and the heaters. Each third electrode is provided on the heaters, and each second electrode is provided at a side portion of the heaters. Each memory cell contains an electro-conductive liquid crystal compound having a long linear conjugate structure and exhibiting a smectic phase as a liquid crystal phase. Information can be written in the memory cells by selectively heating the heaters to cause the corresponding memory cells to have both electroconductivity and optical anisotropy.

7 Claims, 11 Drawing Sheets

| [0] | [1] | [0] | [0] | [1] | [0] | [1] |
| [1] | [0] | [0] | [1] | [0] | [1] | [0] |
| [0] | [1] | [1] | [0] | [1] | [0] | [1] |
| [1] | [1] | [0] | [1] | [0] | [1] | [0] |
| [1] | [0] | [1] | [0] | [0] | [0] | [0] |
| [0] | [1] | [1] | [1] | [0] | [1] | [1] |
| [0] | [0] | [0] | [0] | [1] | [0] | [0] |
| [1] | [0] | [1] | [0] | [0] | [0] | [1] |

Revolved by 45°

Fig.15(a)    Fig.15(b)
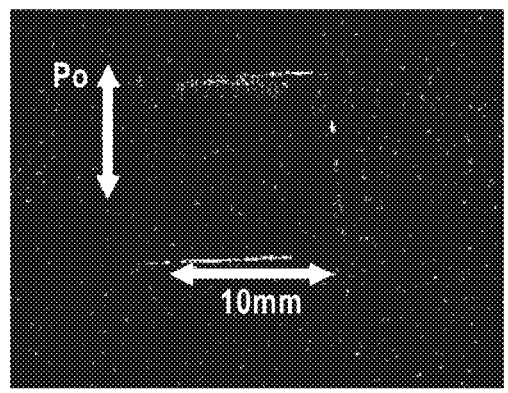 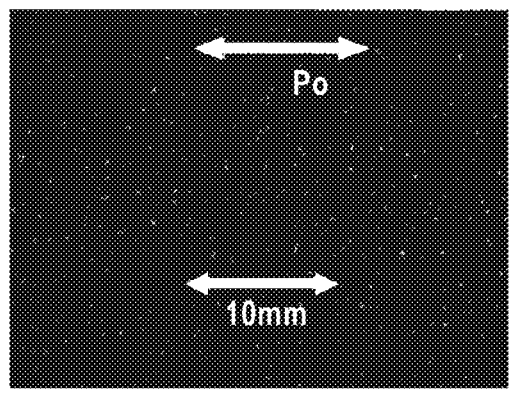
Fluorescence emitted from speicmen irradiated with
nonpolarized UV light, observed through polarizing plate
(PO: transmission axis; angle of deposition: 45°)
Fig.16
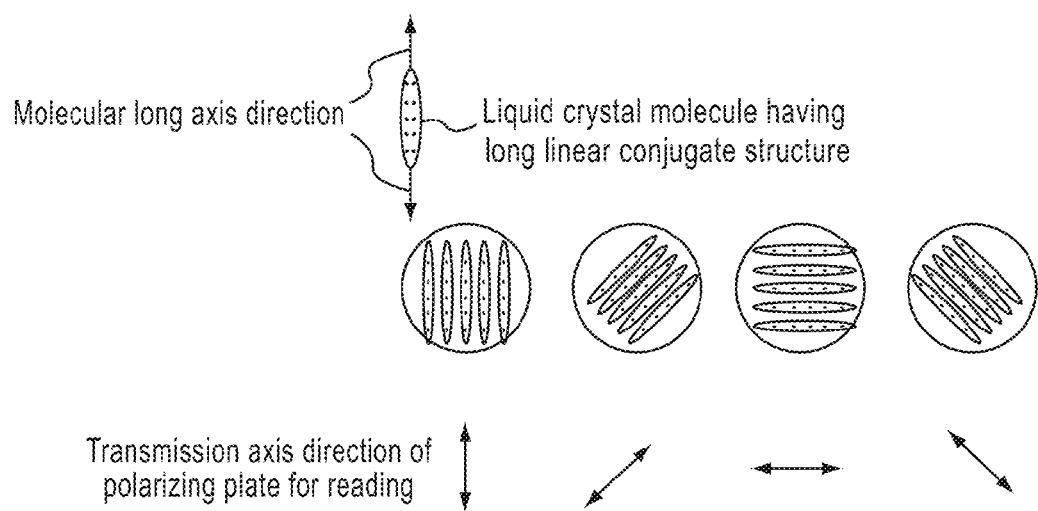

US 7,742,112 B2

MEMORY DEVICE, DATA RECORDING METHOD, AND IC TAG

TECHNICAL FIELD

This invention relates to a memory device, a data recording method, and an IC tag using an electroconductive liquid crystal compound.

BACKGROUND ART

Organic semiconductors have been attracting attention as a semiconductor material taking the place of silicon and compound semiconductors. Production of semiconductor devices using conventional semiconductors necessarily involves high vacuum and high temperature processing operations, which has made cost reduction difficult. In contrast, use of organic semiconductor materials will make it feasible to produce semiconductor devices through a simple processing operation such as coating with a semiconductor solution or vacuum evaporation under room temperature conditions.

The inventors of the present invention previously found that a liquid crystal compound having a long linear conjugate structure and having a smectic phase as a liquid crystal phase develops excellent charge transport properties without requiring photoexcitation with a voltage applied while it is in a smectic phase or in a solid phase as a result of phase transfer from the smectic phase and proposed applying the liquid crystal compound to organic semiconductor devices, such as organic electroluminescent materials and thin film transistors, and information recording media (see, e.g., JP2004-6271A, US2006/0278848A1, US2006/0255318A1, JP2004-311182A, JP2005-142233A, and JP2006-342318A).

SUMMARY OF THE INVENTION

The present invention is contemplated to provide a novel memory device using an electroconductive liquid crystal compound exemplified by the above described liquid crystal compound, and a data recording method and an IC tag using the memory device.

The invention provides a memory device having memory cells which contains an electroconductive liquid crystal compound. The memory device stores information making use of molecular alignment of the liquid crystal compound in its liquid crystalline state formed by selectively heating the memory cells. The memory device comprises a plurality of first electrodes extending in one direction in parallel relation with each other. The memory device also comprises a plurality of memory cells which contain an electroconductive liquid crystal compound having a long linear conjugate structure and exhibiting a smectic phase as a liquid crystal phase. The memory cells are provided on each of the first electrodes discretely at a prescribed spacing in such an arrangement as to form a plurality of straight lines which extend in the extending direction of the first electrodes and to form a plurality of straight lines which extends in the direction crossing the extending direction of the first electrodes. The memory device also comprises a plurality of heaters each provided on each of the memory cells and adapted to heat the memory cells. The memory device also comprises a plurality of second electrodes which extend in one direction in parallel with each other, and cross the first electrodes. The second electrodes are located at a side portion of the heaters which are arranged in a straight line along the extending direction of the second electrodes and are connected to the heaters. The memory device also comprises a plurality of third electrodes which extend in the same direction as the second electrodes in parallel relation with each other. The third electrodes are provided on a plurality of the heaters which are arranged in a straight line along the extending direction of the third electrodes, and are connected to the heaters.

The invention also provides a data writing method using the above described memory device. The method comprises applying a voltage between the second electrode and the third electrode to selectively drive the heater thereby to selectively heat the memory cell containing the electroconductive liquid crystal compound in a state with no liquid crystal molecular alignment to cause the electroconductive liquid crystal compound to form a molecular alignment of the liquid crystal phase, whereupon the heated memory cell simultaneously gains both electroconductivity and optical anisotropy.

The invention also provides a data writing method using the above described memory device. The method comprises applying a voltage between the second electrode and the third electrode to drive the heater thereby to heat the memory cell containing the electroconductive liquid crystal compound in a state having liquid crystal molecular alignment perpendicular to the electrodes or in a state having random molecular orientation and applying an electric field or a magnetic field to the heated memory cell to cause the electroconductive liquid crystal compound to form a molecular alignment in the liquid crystal phase by making use of dielectric anisotropy and magnetic susceptibility anisotropy. As a result, a spot emitting fluorescence polarized in the molecular long axis direction of the electroconductive liquid crystal compound is formed to achieve optical multiplex writing in the same spot.

The invention also provides a data reading method for reading data written by the above described data writing method. The reading method comprises irradiating the memory cell emitting fluorescence polarized in the molecular long axis direction of the electroconductive liquid crystal compound with exciting light and aligning the transmission axis of a polarizing plate with the oscillation direction of the polarized fluorescence.

The invention also provides an IC tag (also called the third invention) including the above memory device according to the invention.

BRIEF DESCRIPTION OF THE DRAWINGS

FIG. 15(a) and FIG. 15(b) are polarizing micrographs of the electroconductive liquid crystal semiconductor material layer prepared in Example after being heat treated at 150° C. for 3 minutes followed by being cooled to room temperature (25° C.) spontaneously into a solid phase, from which it is observed that the liquid crystal compound emits fluorescence polarized in the molecular long axis direction.

FIG. 16 schematically illustrates the relation between the long axis direction of liquid crystal molecules in the memory device of FIG. 1 and the transmission axis of a polarizing plate used for data reading.

DETAILED DESCRIPTION OF THE INVENTION

Figure 1:
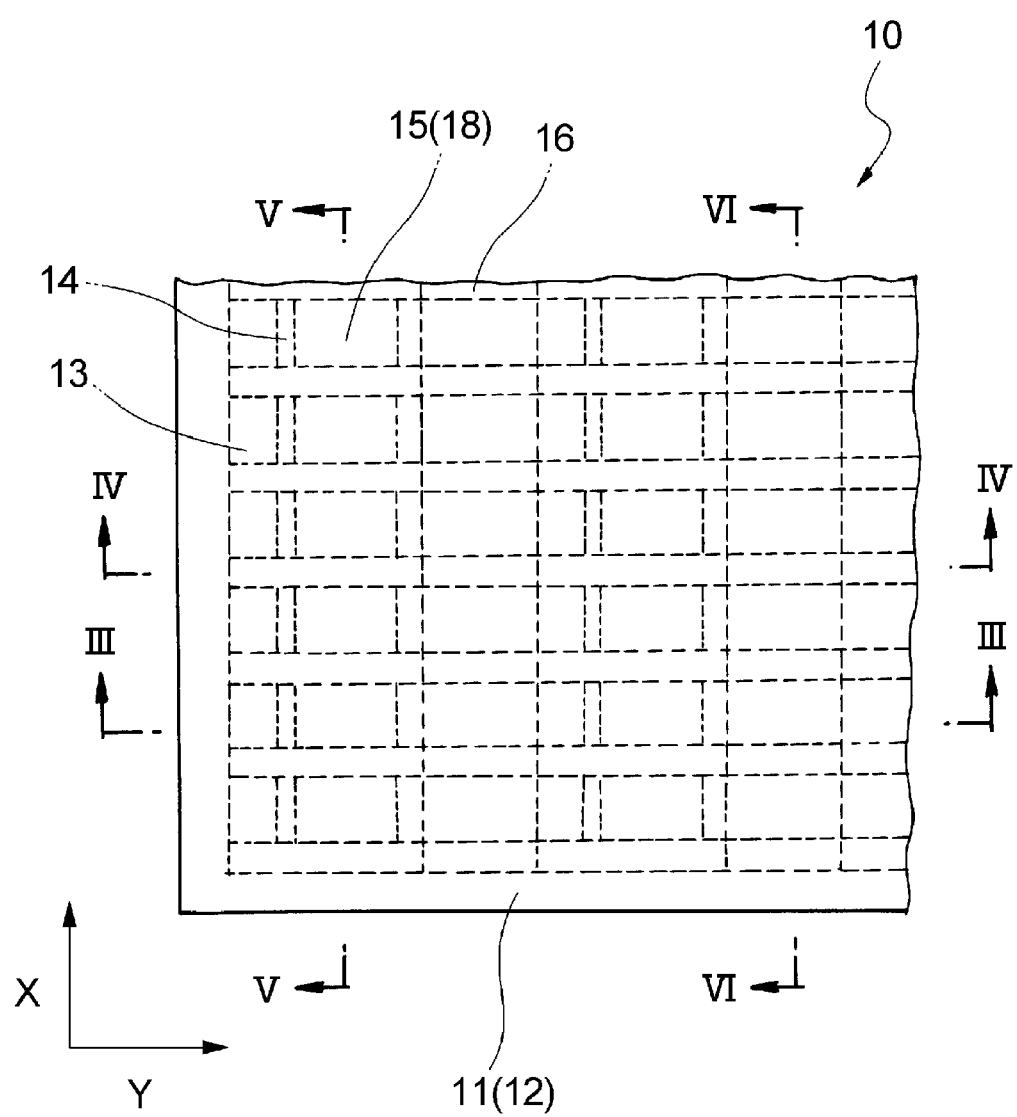
FIG. 1 is a plan showing an embodiment of the memory device according to the invention.
Figure 2:
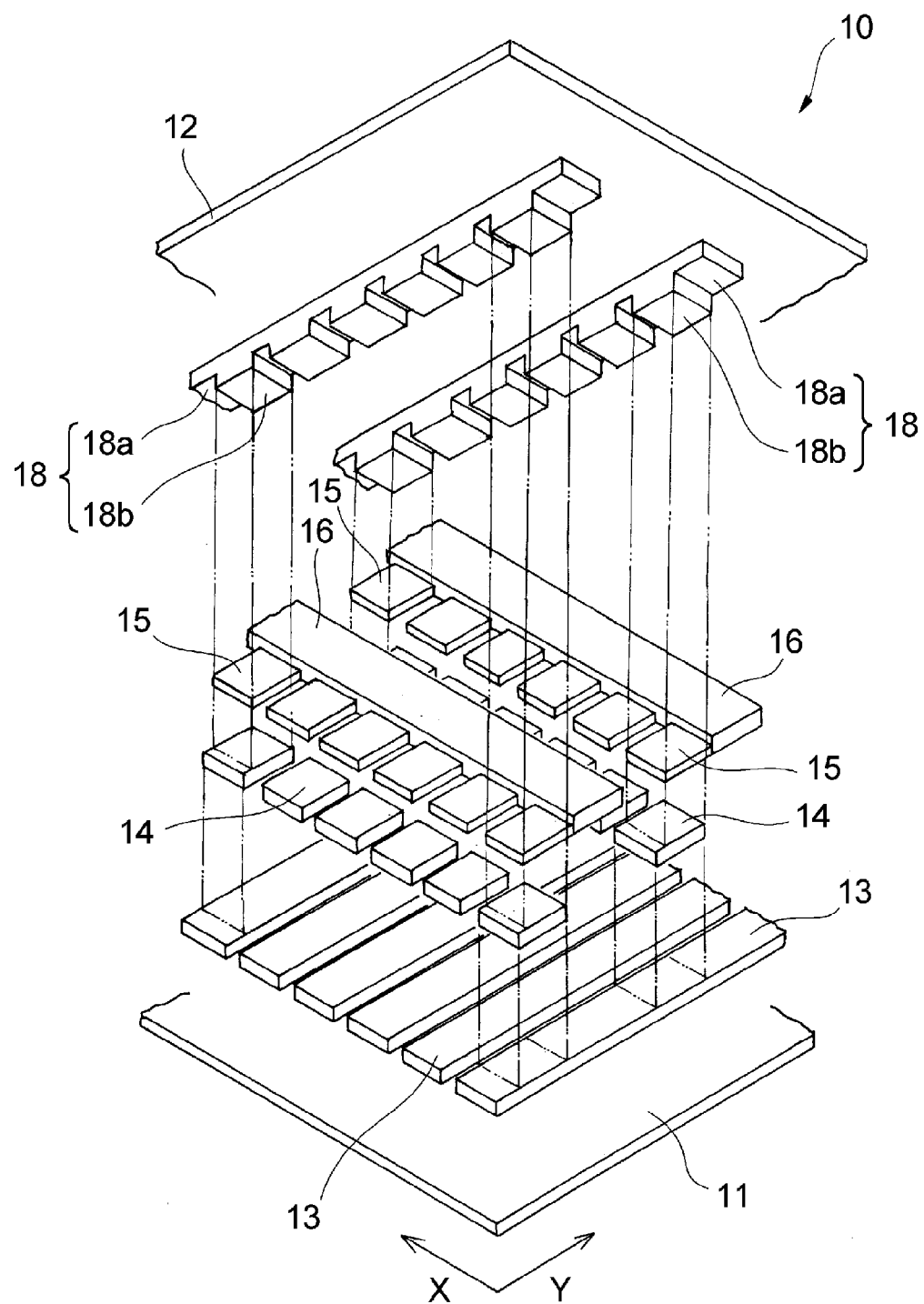
FIG. 2 is a developed perspective of the memory device shown in FIG. 1.

The present invention will be described based on its preferred embodiments by referring to the accompanying drawing. FIG. 1 is a plan of a preferred embodiment of the memory device according to the invention. FIG. 2 is a developed perspective of the memory device of FIG. 1. FIGS. 3 through 6 are cross-sections taken along line III-III, line IV-IV, line V-V, and line VI-VI in FIG. 1, respectively.

The memory device 10 of the present embodiment has a lower substrate 11 and an upper substrate 12. Each substrate is rectangular, having the direction X and a direction Y perpendicular to the direction X. The lower substrate 11 has provided directly thereon a plurality of first electrodes 13. All the first electrodes 13 are strips of the same width extending in one direction in parallel relation with each other. The extending direction of the first electrodes 13 is coincident with the direction Y of the substrates 11 and 12. The first electrodes 13 are equally spaced in the direction X. In what follows, the term "width" will be used to refer to a dimension in the direction X.

On each of the first electrodes 13 are discretely provided a plurality of memory cells 14 at a prescribed spacing. The memory cells 14 are provided directly on the first electrodes 13. The width of each memory cell 14 is equal to that of the first electrode The length of the memory cell 14 is slightly longer than the width. The individual memory cells 14 are arranged as if they are at the intersections of a grating in a plan view of the memory device 10. To put it another way, the memory cells 14 are arranged to form a plurality of straight lines extending in the direction Y of the substrates 11 and 12, i.e., the extending direction of the first electrodes 13, and also to form a plurality of straight lines extending in the direction X of the substrates 11 and 12, i.e., the direction perpendicular to the extending direction of the first electrodes 13.

Figure 3:
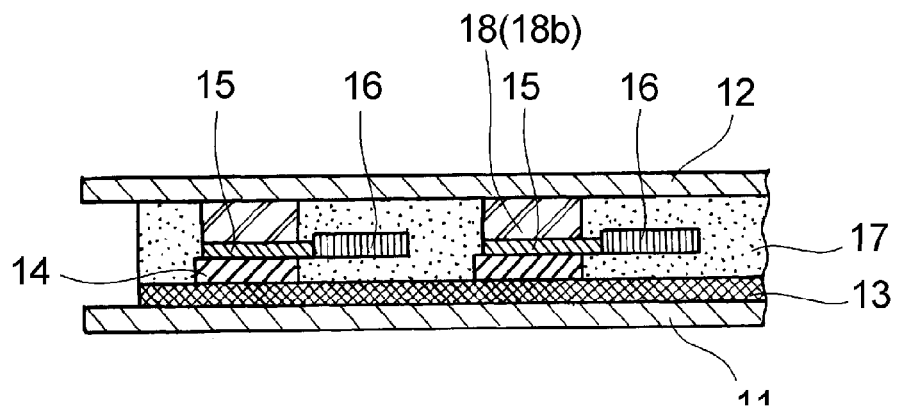
FIG. 3 is a cross-section taken along line III-III in FIG. 1.
Figure 4:
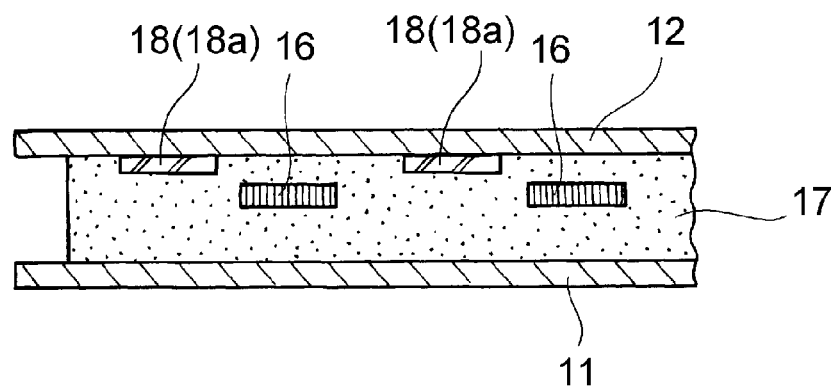
FIG. 4 is a cross-sectional taken alone line IV-IV in FIG. 1.
Figure 5:
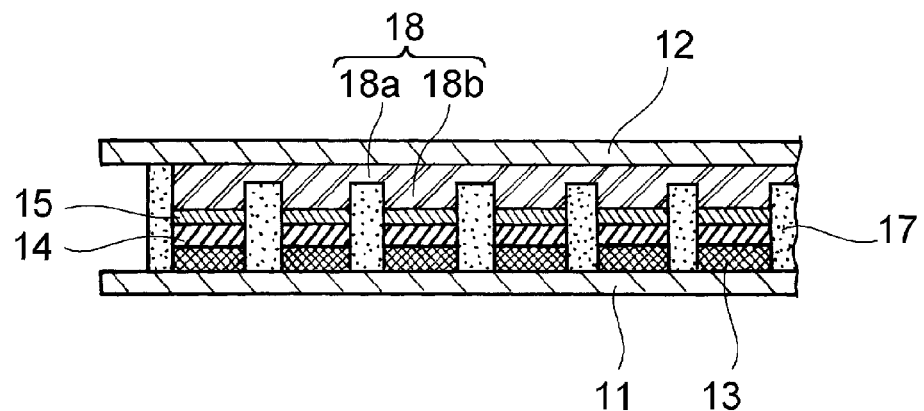
FIG. 5 is a cross-section taken alone line V-V in FIG. 1.
Figure 6:
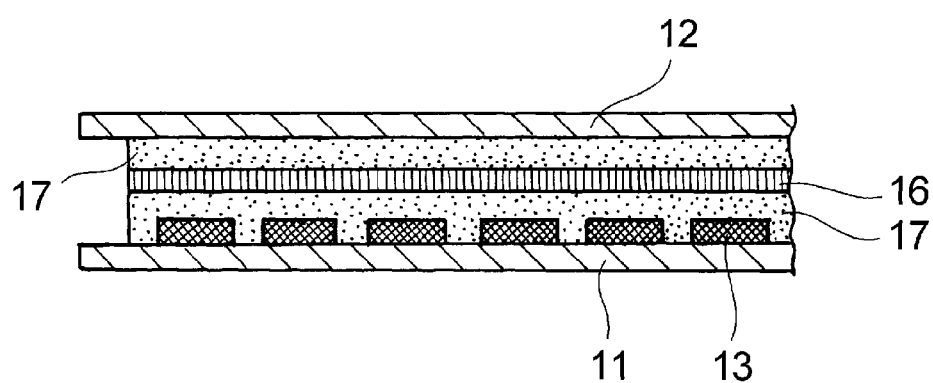
FIG. 6 is a cross-section taken along line VI-VI in FIG. 1.

On each of the memory cells 14 is directly formed a heater 15 used to heat the corresponding memory cell 14. The heater 15 has the same width as the memory 14 and the first electrode 13 and has a slightly smaller length than the memory cell 14. The memory cell 14 slightly sticks out of one end of the heater 15 in the direction Y as illustrated in FIGS. 2 and 3. Similarly to the memory cells 14, the heaters 15 are arranged as if they are at the intersections of a grating in a plan view. That is, the heaters 15 are arranged to form a plurality of straight lines extending in the direction Y of the substrates 11 and 12, i.e., the extending direction of the first electrodes 13, and also to form a plurality of straight lines extending in the direction X of the substrates 11 and 12, i.e., the direction perpendicular to the extending direction of the first electrodes 13.

A plurality of second electrodes 16 are provided at a side portion of the heaters in the direction Y. The second electrodes 16 are extending in one direction aligned in parallel with each other and crossing the first electrodes 13. More specifically, the second electrodes 16 extend in the direction X in perpendicular relation with the first electrodes 13. All the second electrodes 16 have the shape of a strip with an equal width and equally spaced in direction Y. Each second electrode 16 is connected to a group of the heaters 15 arranged in a straight line extending along the extending direction of the second electrode 16.

As illustrated in FIGS. 1 through 6, in the memory device 10 the second electrodes 16 are embedded in an insulator 17 and electrically isolated from third electrodes 18 hereinafter described. The second electrodes 16 are connected to the third electrodes 18 only via the heaters 15. Therefore, the heaters 15 are driven by applying a voltage between the second electrode 16 and the third electrode 18.

Third electrodes 18 are provided on the heaters 15. The third electrodes 18 are strips of equal width arranged in one direction aligned parallel relationship. The longitudinal direction, i.e., the extending direction of the third electrodes 18 is coincident with the direction X of the substrates 11 and 12, i.e., the extending direction of the second electrodes 16. As shown in FIG. 3, the length of the individual third electrodes 18 in the direction Y is slightly smaller than the length of the individual heaters 15 in the same direction. Each of the third electrodes 18 is disposed right on a group of the heaters 15 arranged in a straight line along the extending direction of the second electrode 16 (the direction X).

The third electrode 18 is composed of a flat base 18a having a strip shape with a prescribed width and rectangular parallelepipedal projections 18b projecting downward from the lower side of the base 18a. The projections 18b are discretely provided at a regular spacing in the longitudinal direction of the base 18b. The spacing of the projections 18b coincides with the spacing of the heaters 15 aligned in a straight line along the direction X of the substrates 11 and 12, i.e., the extending direction of the second electrode 16 (see FIG. 5). The third electrode 18 connects on the lower side of its projections 18 to the heaters 15 aligned in a straight line. The other part of the third electrode 18 does not connect to the heaters 15. The third electrode 18 directly connects to the upper substrate 12 on the upper side of the base 18a.

The lower substrate 11 and the upper substrate 12 are not particularly limited in material. Examples of the materials include glass, synthetic resins, and natural resins, used either individually or as a mixture, copolymer or composite thereof. Specific examples include thermoplastic resins such as polyester resins, acrylonitrile-styrene resins, acrylic resins, polyethylene resins, polypropylene resins, polyamide resins, polyacetal resins, polycarbonate resins, ABS resins, polyethylene terephthalate (PET) resins, polyvinyl chloride resins, vinyl acetate resins, polylactic acid resins, polyvinyl alcohol resins, polyurethane resins, modified PPO resins, polybutylene terephthalate resins, and polyphenylene sulfide resins; and polyblends or copolymers thereof. Reinforced resins such as glass-, pigment- or filler-reinforced resins are also useful. Biodegradable resins such as polylactic acid, polycaprolactone, poly(3-hydroxy-butyrate-hydroxyvalerate), and polyvinyl alcohol resins are also useful. The resins recited may be used either individually or in the form of a polyblend or copolymer thereof.

The material making up the first electrode 13 is not particularly limited as long as it is electroconductive. Examples include platinum, gold, silver, nickel, chromium, copper, iron, tin, antimonial, lead, tantalum, indium, palladium, tellurium, rhenium, iridium, aluminum, ruthenium, germanium, molybdenum, tungsten, tin antimony oxide, indium tin oxide (ITO), fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, sodium-potassium alloy, magnesium/copper mixture, magnesium/silver mixture, magnesium/aluminum mixture, magnesium/indium mixture, aluminum/aluminum oxide mixture, and lithium/aluminum mixture. Known electrically conductive polymers having conductivity increased by doping, such as conductive polyaniline, conductive polypyrrole, and conductive polythiophene, polyethylenedioxythiophene-polystyrenesulfonic acid complex, and the like are also suitable. Preferred of them are those having small electrical resistance on the interface with a semiconductor layer.

The first electrode 13 has a width, e.g., of 0.1 to 200 μm, preferably 5 to 100 μm, and a thickness, e.g., of 0.01 to 2 μm.

The memory cells 14 contain an electroconductive liquid crystal compound functioning as an information recording medium in the memory device 10. Usually, the memory cells 14 contain the electroconductive liquid crystal compound in the state with no molecular alignment. The memory cells 14 are selectively heated by the heaters 15 (described later), and only the selectively heated memory cells show molecular alignment of a smectic phase. These memory cells (spots with a smectic liquid crystal state) exhibit not only electroconductivity but optical anisotropy at room temperature. Should electrical reading failure occur, therefore, the memory device 10 of the present embodiment can read out the information from the memory cells 14 through an optical method and secures an excellent backup function.

The memory cell 14 contains an electroconductive liquid crystal compound having a long linear conjugate structure and exhibiting a smectic phase as a liquid crystal phase. The memory cell 14 preferably contains 70% by weight or more, more preferably 90% by weight or more, of the electroconductive liquid crystal compound. With the electroconductive liquid crystal compound content of 70% by weight or more, the memory cell 14 retains the molecular alignment of the smectic phase easily. By heating treatment, the memory cell 14 increases its electroconductivity and is therefore capable of writing information easily by the heat treatment with the heater 15.

The memory cell 14 has the same width as the first electrode 13 as stated. The memory cell 14 preferably has a length of about 0.1 to 200 μm and a thickness of about 0.01 to 2 μm.

The electroconductive liquid crystal compound having a long linear conjugate structure and exhibiting a smectic phase as a liquid crystal phase (hereinafter also referred to as "the electroconductive liquid crystal compound of the invention") is exemplified by those represented by general formulae (3a) to (3g):

  (3a)

  (3b)

  (3c)

  (3d)

  (3e)

  (3f)

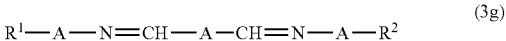  (3g)

In formulae (3a) to (3g) representing the electroconductive liquid crystal compounds of the invention, $R^1$ and $R^2$ each represent a straight-chain or branched alkyl group, a straight-chain or branched alkoxy group, a cyano group, a nitro group, F, $-C(O)O(CH_2)_m-CH_3$, $-C(O)-(CH_2)_m-CH_3$, or general formula (2) below; and n represents an integer of 1 to 3;

  (2)

wherein $R^3$ represents a hydrogen atom or a methyl group; B represents $-(CH_2)_m-$, $-(CH_2)_m-O-$, $-CO-O-(CH_2)_m-$, $-C_6H_4-CH_2-O-$ or $-CO-$; and m represents an integer of 1 to 18.

In formulae (3a) to (3g), the alkyl group as $R^1$ and $R^2$ preferably has 3 to 20 carbon atom. Examples of the alkyl group are butyl, hexyl, heptyl, octyl, nonyl, decyl, dodecyl, pentadecyl, and octadecyl. In particular, the compound in which the branched alkyl group is represented by $CH_3-(CH_2)_x-CH(CH_3)-(CH_2)_y-CH_2-$ (wherein x is an integer of 0 to 7, and y is an integer of 0 to 7) has increased solubility in various solvents. The alkoxy group as $R^1$ and $R^2$, represented by general formula $C_nH_{2n+1}O-$, preferably has 3 to 20 carbon atoms. In particular, the compound in which the branched alkoxy group is represented by $CH_3-(CH_2)_x-CH(CH_3)-(CH_2)_Y-CH_2-O-$ (wherein x is an integer of 0 to 7, and y is an integer of 0 to 7) has increased solubility in various solvents. A in the formulae (3a) to (3g) is exemplified by the groups represented by general formulae (4a) to (4e):

  (4a)

  (4b)

  (4c)

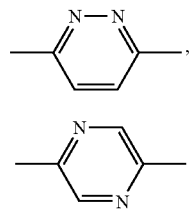

(4d)

(4e)

The electroconductive liquid crystal compound of the invention may be a cis-isomer, a trans-isomer or a mixture thereof.

The electroconductive liquid crystal compound of the invention is preferably a styrene derivative represented by general formula (1):

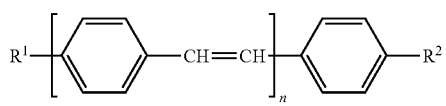

(1)

wherein $R^1$ and $R^2$ are as defined above; and n represents an integer 2 or 3.

Reaction scheme (1):

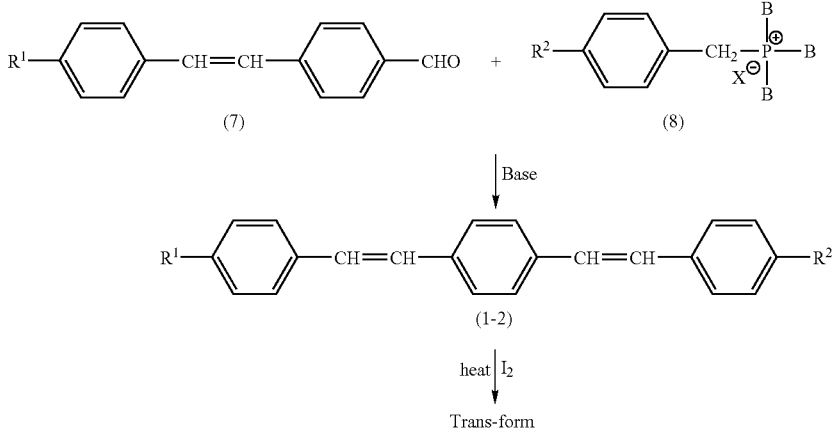

($R = R^1 = R^2$; $R^1$ and $R^2$ are as defined above)

The reaction of reaction scheme (1) is carried out using p-xylylenebis(triphenylphosphonium bromide) (compound (6)), a benzaldehyde compound (compound (5)) preferably of an amount of 2 to 4 mol, more preferably 2 to 2.5 mol, per mole of compound (6), and a base (e.g., an alkoxide) preferably of an amount of 1 to 5 mol, more preferably 3.5 to 4.5 mol, per mole of compound (6) in a solvent such as an alcohol (e.g., methanol or ethanol). The reaction is preferably carried out at 0° C. to 100° C., more preferably 20° C. to 50° C., for 0.5 to 50 hours, more preferably 5 to 30 hours. This reaction yields a desired styryl derivative of general formula (1) (compound (1-1)) (see JP 2004-6271A and US 2006/0255318A1).

Reaction scheme 2:

($R^1$ and $R^2$ are as defined above; B represents a monovalent organic group such as methyl, ethyl or phenyl; and X represents a halogen atom such as chlorine or bromine.)

The styryl derivative represented by general formula (1) is easily prepared in accordance with reaction schemes (1), (2) or (3) shown below.

Reaction scheme (1) provides a styryl derivative in which $R^1=R^2$, and n=2. Reaction scheme (2) gives a styryl derivative in which $R^1 \neq R^2$, and n=2. Reaction scheme (3) yields a styryl derivative in which n=3.

The reaction of reaction scheme (2) is between a benzaldehyde derivative (compound (7)) and a phosphonium salt (compound (8)) preferably of an amount of 1 to 3 mol, more preferably 1 to 1.5 mol, per mole of compound (7) in the presence of a base (e.g., an alkoxide) preferably of an amount of 1 to 4 mol, more preferably 2 to 3 mol, per mole of compound (7) in a solvent such as an alcohol (e.g., methanol or ethanol). The reaction is preferably carried out at −20° C.

to 50° C., more preferably −5° C. to 25° C., for 1 to 20 hours, more preferably 5 to 15 hours. This reaction affords a desired styryl derivative of general formula (1) (compound (1-2)) (see U.S. 2006/0278848A1).

Reaction scheme 3:

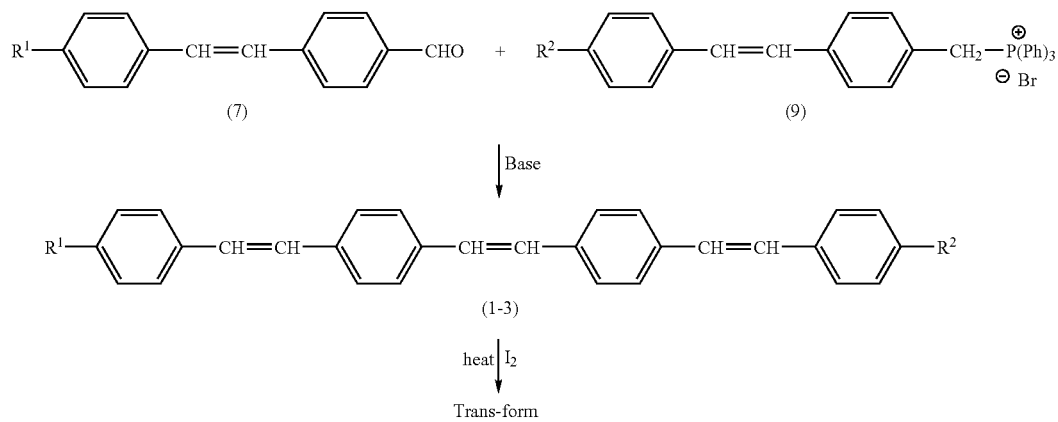

($R^1$ and $R^2$ are as defined above)

The reaction of reaction scheme (3) is between a benzaldehyde derivative (compound (7)) and a phosphonium salt (compound (9)) preferably of an amount of 0.9 to 1.1 mol, more preferably about 1 mol, per mole of compound (7) in the presence of a base (e.g., an alkoxide) preferably of an amount of about 0.8 to 5 mol per mole of compound (9) in a solvent such as an alcohol (e.g., methanol or ethanol). The reaction is preferably carried out at 0° C. to 150° C., more preferably 30° C. to 80° C., for a period of 5 hours or longer, more preferably 10 to 30 hours. This reaction gives a desired styryl derivative of general formula (1) (compound (1-3)) (see JP 2006-37149A).

The styryl derivatives obtained through the reactions in accordance with reaction schemes (1), (2), and (3), namely the compounds (1-1), (1-2), and (1-3) can be selectively converted to the corresponding trans-form by heating in a solvent in the presence of iodine. The iodine is preferably added in an amount of 0.001 to 0.1 mol, more preferably 0.005 to 0.01 mol, per mole of the styryl derivative (compound (1-1), (1-2) or (1-3)). The heating temperature is preferably 100° C. to 180° C., more preferably 130° C. to 150° C. Examples of the solvent that can be used for the heat treatment include benzene, toluene, o-xylene, m-xylene, p-xylene, chlorobenzene, o-dichlorobenzene, m-dichlorobenzene, and p-dichlorobenzene. These solvents may be used either individually or as a mixture thereof.

It is particularly preferred to make the memory cells 14 using two or more components selected from the styryl derivatives represented by general formula (1) and having different alkyl chain lengths because such memory cells have improved memory of the liquid crystal molecular alignment of the smectic phase. The molecular alignment of the smectic phase is memorized by such memory cells almost perfectly even after the temperature is returned to room temperature. Such memory cells are also preferred for their high electroconductivity.

When the styryl derivatives of general formula (1) having different alkyl chain lengths are used in combination, any of two or more styryl compounds to be combined are preferably selected from those having 3 to 18 carbon atoms in the alkyl chain. In the case where $R^1$ or $R^2$ is an alkoxy group, the term "alkyl chain" as used herein means the alkyl moiety $C_nH_{2n+1}$ of the alkoxy group $C_nH_{2n+1}O$—.

Preferred combinations to make the memory cells 14 include a combination of (A) a distyryl derivative of general formula (1) in which $R^1$ and $R^2$ are selected from an alkyl group having 12 to 18 carbon atoms and an alkoxy group represented by general formula: $C_nH_{2n+1}O$— (n is an integer of 12 to 18) and (B) a styryl derivative of general formula (1) in which $R^1$ and $R^2$ are selected from an alkyl group having 6 to 11 carbon atoms and an alkoxy group represented by general formula: $C_nH_{2n+1}O$— (n is an integer of 6 to 11).

In the case where the memory cells 14 are formed of a mixture of two or more components as described above, it is preferred that the memory cells exhibit a smectic phase at a temperature in the rage of 100° C. to 250° C., more preferably 130° C. to 250° C. In this case, the memory cells have heat resistance at practical temperatures of about 100° C. at the lowest, preferably about 130° C., and exhibit high electroconductivity at room temperature. In view of this, it is preferred that the mixing ratio of the two or more components to be combined to constitute the memory cells 14 is adjusted so that the temperature range in which a smectic phase is exhibited may be from 100° C. to 250° C., more preferably 130° C. to 250° C. Such a mixing ratio largely varies depending on the selected liquid crystal compounds having a long linear conjugate structure and having a smectic phase as a liquid crystal phase. In using, for example, a combination of (A) a styryl derivative of general formula (1) in which $R^1$ and $R^2$ are each an alkoxy group $C_{15}H_{31}O$— and (B) a styryl derivative of general formula (1) in which $R^1$ and $R^2$ are each an alkoxy group $C_{10}H_{21}O$—, which is one of the preferred combinations, the molar ratio of the styryl derivative (B) to the styryl derivative (A) is 0.90 to 1.10, preferably 1.

In writing data in the present invention, the molecular alignment in the liquid crystalline state can efficiently be controlled by making the memory cells 14 of a liquid crystal material containing at least a liquid crystal compound having positive dielectric anisotropy and positive magnetic susceptibility anisotropy. Preferred examples of the liquid crystal compounds having positive dielectric anisotropy and positive magnetic susceptibility anisotropy are electroconductive liquid crystal compounds represented by general formulae (3a) to (3g) in which either $R^1$ or $R^2$ is a cyano group or a nitro group. The amount of the electroconductive liquid crystal compound having positive dielectric anisotropy and magnetic susceptibility anisotropy is preferably at least 10% by weight, more preferably 30% by weight or more.

The heater 15 has a function to heat the memory cell 14 to cause the electroconductive liquid crystal compound in the memory cell 14 to create molecular alignment of the liquid crystal state, resulting in the selective formation of the memory cell 14 which exhibits both electroconductivity and optical anisotropy. In addition, the heater 15 mediates detection of the electroconductivity of the memory cell 14 between the first electrode 13 and the third electrodes 18.

Materials making the heaters 15 are not particularly limited as long as they heat through ohmic heating. Examples of useful materials include pyrolytic graphite, molybdenum, tantalum, tungsten, Ni—Cr alloy, Fe—Cr alloy, and Fe—Cr—Al alloy. The heater 15 is as wide as the first electrode 13 and is preferably about 0.1 to 1 µm thick.

Materials making the second electrodes 16 and the third electrodes 18 are not particularly limited as long as they have electroconductivity. For example, the same materials as used to form the first electrodes 13 can be used. The second electrodes 16 and the third electrodes 18 may have the same width and thickness as the first electrodes 13.

The insulator 17 may be made of any electrically insulating material, such as polyimide, polychloroprene, polyethylene terephthalate, polyoxymethylene, polyvinyl chloride, polyvinylidene fluoride, cyanoethyl pullulan, polymethyl methacrylate, polysulfone, polycarbonate, aluminum nitride; oxide ceramics such as alumina, $SiO_2$, mullite, and cordierite; silicon nitride, and silicon carbide.

In order for the memory device 10 of the present embodiment to be read not only electrically but optically, it is preferred that at least the lower substrate 11 and the first electrodes 13 are transparent.

Each of the electrodes 13, 16, and 18 is electrically connected to circuitry (not shown) such as a semiconductor integrated circuit for driving the memory device 10.

The memory device 10 is capable of writing data by selectively heating the memory cells 14 containing the electroconductive liquid crystal compound by the heaters 15. In detail, a voltage is applied between the second electrode 16 and the third electrode 18 to selectively drive the heaters 15. The selectively driven heaters 15 heat the corresponding memory cells 14 containing the electroconductive liquid crystal compound in the state with no liquid crystal molecular alignment to cause the electroconductive liquid crystal compound to form a liquid crystal molecular alignment. As a result, these memory cells 14 become spots having both electroconductivity and optical anisotropy. Information can thus been written making use of the difference in electroconductivity and optical anisotropy between the thus formed electroconductive spots and non-electroconductive spots. This method allows for reading information by either an electrical method or an optical method. Data recording by use of the memory device 10 can be carried out, for example, as follows.

Figure 7A:
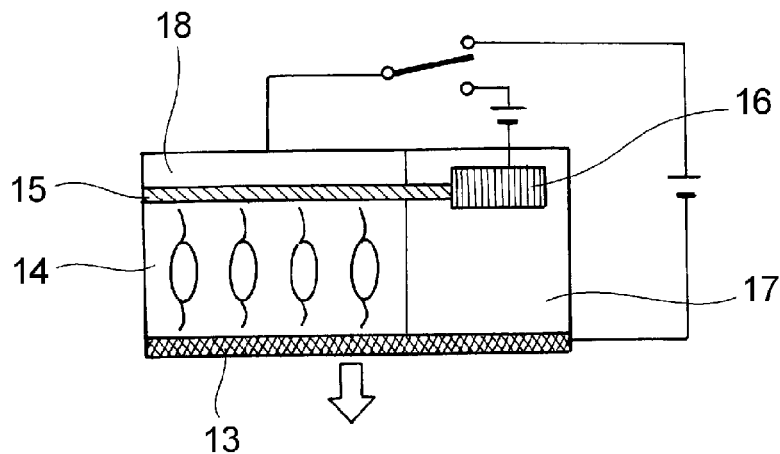
FIG. 7(a), FIG. 7(b), and FIG. 7(c) are schematic diagrams of the memory device of FIG. 1, in which information is being written and read out.
Figure 7B:
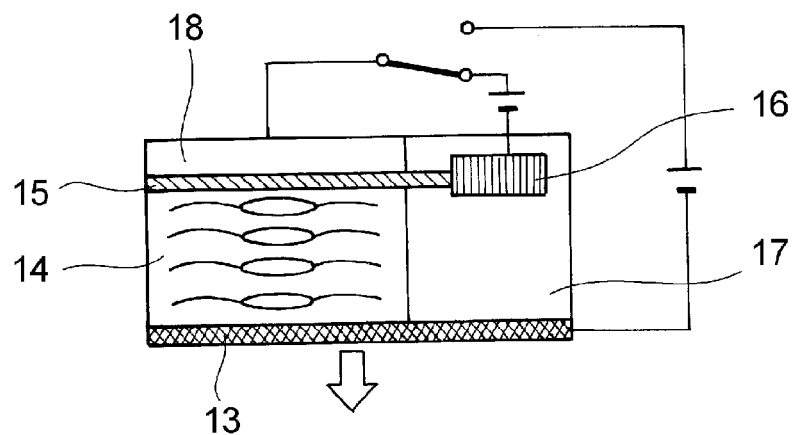
Figure 7C:
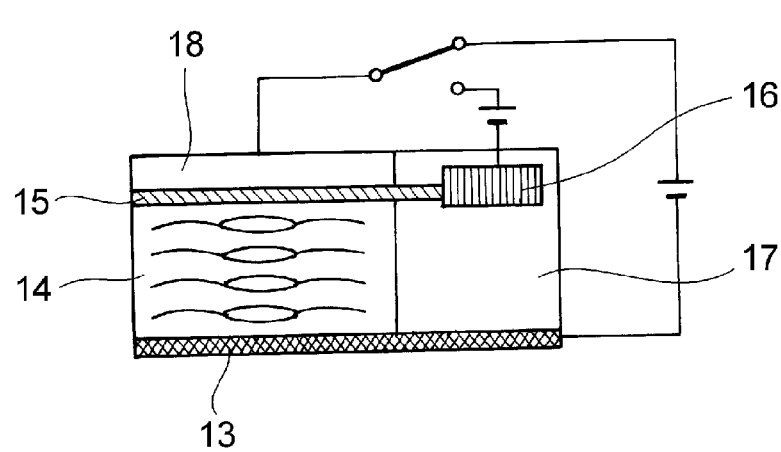

In writing data using the memory device 10 of the present embodiment, a voltage is applied between the second electrode 16 and the third electrode 18. The heaters 15 heat up to a predetermined temperature as a result. By this heat the electroconductive liquid crystal compound in the memory cells 14 adjoining the driven heaters 15 undergoes phase change to a smectic liquid crystal phase. The memory cells 14 which are not heated remain electrically insulating, whereas only the memory cells 14 which are heated by the heaters 15 exhibit a smectic liquid crystal phase and, even after allowed to cool to room temperature, keep the smectic phase almost perfectly, continuing showing extremely high electroconductivity and optical anisotropy. More concretely, FIG. 7(a) illustrates a memory cell containing the electroconductive liquid crystal compound in its state having insulating properties and no optical anisotropy. On being heat treated selectively, the liquid crystal compound in the memory cell of FIG. 7(a) undergoes a phase change to a smectic phase as illustrated in FIG. 7(b), whereby the memory cell gains extremely high electroconductivity and optical anisotropy. In this manner, data writing can be achieved by making use of the thus produced difference between the heat treated memory cells and other non-heat treated memory cells in electroconductivity and optical anisotropy. The information written in the memory device 10 can be read out from the electroconductive spots and non-electroconductive spots by applying a voltage between the first electrodes 13 and the third electrodes 18 as illustrated in FIG. 7(c).

The heating temperature of the heater 15 is not particularly limited as long as it falls within a range of from the phase transition temperature to a smectic phase of the electroconductive liquid crystal compound in the memory cell 14 up to the decomposition temperature of the compound. In using the above-described preferred electroconductive liquid crystal compounds, the heating temperature is preferably 100° C. to 250° C., more preferably 130° C. to 250° C. The temperature of the heater 15 can be controlled by adjusting the amount of the current supplied to the heater 15.

In the memory device 10 of the present embodiment before writing (before the heat treatment), the proportion of the electroconductive liquid crystal compound having no liquid crystal molecular alignment in all the electroconductive liquid crystal compounds present in the memory cell 14 is preferably at least 95% by weight, more preferably 99% by weight or more. With that proportion being 95% by weight or more, the reliability of the data written is sufficiently ensured.

Figures 8, 9:
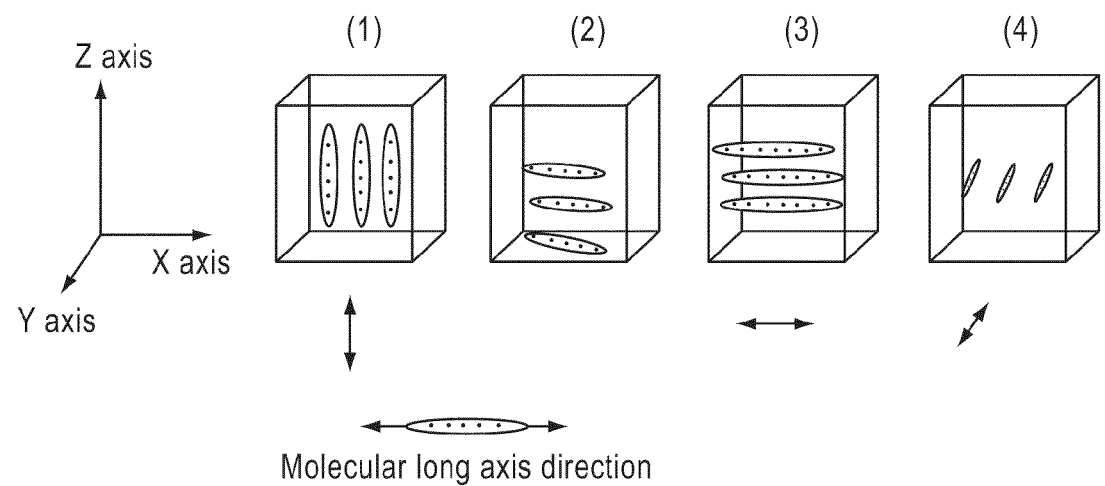
FIG. 8 is a schematic diagram showing the bits 0 and 1 written in the memory cells of the memory device after the memory cells are selectively heated by the heaters.
FIG. 9 is a schematic showing molecular alignments in the memory cell of the memory device shown in FIG. 1, which are formed by applying heat and a magnetic field to the memory cell.

As illustrated in FIG. 8, the above described selective heat treatment achieves binary data recording composed of spots "1" with high conductivity and optical anisotropy and spots "0" with low conductivity and high optical anisotropy to the memory cell 14. The binary data "0" and "1" thus written into the memory device 10 can be read out by connecting the device 10 to an existing readout circuit.

In the memory cell 10 of the present embodiment, a memory cell 14 having liquid crystal alignment perpendicular to the electrodes or having the electroconductive liquid crystal compound molecules oriented randomly becomes a spot emitting fluorescence polarized in the molecular long axis direction of the electroconductive liquid crystal compound on being heated selectively by the adjoining heater 15. Accordingly, the data recording method using the memory device 10 of the present embodiment includes an embodiment in which a voltage is applied between the second electrode 16 and the third electrode 18 to drive the heater 15 thereby to heat the adjoining memory cell 14 containing the electroconductive liquid crystal compound in is the state having no liquid crystal molecular alignment; an electric field or a magnetic field is applied to the memory cell 14 to align the liquid crystal molecules taking advantage of the dielectric anisotropy and the magnetic susceptibility anisotropy, thereby forming a spot emitting fluorescence polarized in the molecular long axis direction of the electroconductive liquid crystal compound. This embodiment realizes optical multiplex writing on the same spot.

The above mentioned multiplex writing takes advantage of the molecular alignment of the liquid crystal compound formed by the heat treatment of the memory cell 14 and the property of the liquid crystal compound that the molecular long axes are oriented in the direction of an applied magnetic field. High magnetic field intensities are not problematic. The field intensity is in most cases 0.3 T or higher, preferably 0.5 T or higher. Optical multiplex writing for storing, for example, four pieces of information in one spot of molecular alignment can be performed in accordance with the following sequence of operations (1) to (4). FIG. 9 is referred to.

(1) All the memory cells 14 are heated with the heaters 15, followed by cooling while applying a magnetic field in the vertical direction (Z-axis) by, for example, electromagnetic treatment. As a result, the molecules are aligned with their molecular long axes vertical (longitudinally aligned in Z-axis). See FIG. 9(1).

(2) The memory cells 14 are heated by the heaters 15 without applying a magnetic field. As a result, the molecules are aligned with their molecular long axes parallel with the x-y axial plane but randomly directed. See FIG. 9(2).

(3) The memory cells 14 are heated with the heaters 15, followed by cooling while applying a magnetic field in the direction of x-axis. As a result, the molecules are aligned with their long axes parallel with x-axis. See FIG. 9(3).

(4) The memory cells 14 are heated with the heaters 15, followed by cooling while applying a magnetic field by, for example, electromagnetic treatment in y-axis. As a result, the molecules are aligned with their long axes parallel with y-axis. See FIG. 9(4).

To read out the data optically written in one spot in a multiplex mode, it is preferred for at least the lower substrate 11 and the first electrodes 13 to be made of a transparent material.

Readout of the data written on the memory device 10 in a multiplex mode by the above described data writing method can be carried out by irradiating the spots emitting fluorescence polarized in the molecular long axis direction of the electroconductive liquid crystal compound with exciting light and aligning the transmission axis of a polarizing plate with the oscillation direction of the thus emitted polarized fluorescence. In another readout method, the spots are irradiated with exciting light and two-dimensionally detecting the differences in luminescence intensity depending on the molecular alignment with a CCD camera. The spots may be irradiated with exciting light and scanned in a line-by-line manner to detect the differences in luminescence intensity depending on the molecular alignment. It is advantageous to use polarized ultraviolet light as exciting light in that the reflected light intensity of each spot is easier to read. It is preferred to place a polarizing plate on the readout side of the memory device 10 so as to detect fluorescence polarized in one direction, thereby allowing for reading the differences in luminescence intensity.

Figure 10A:
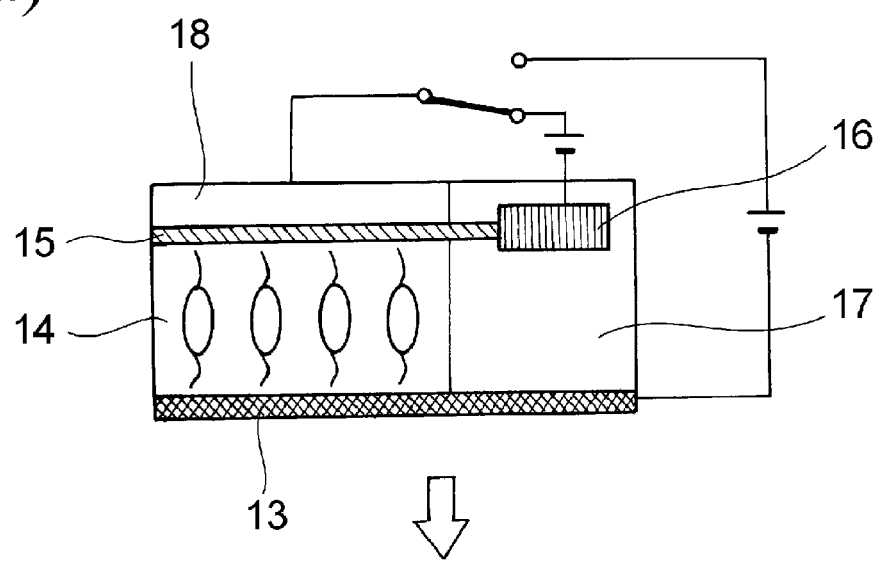
FIG. 10(a) and FIG. 10(b) are schematic diagrams showing the memory device of FIG. 1, in which information written is being erased.
Figure 10B:
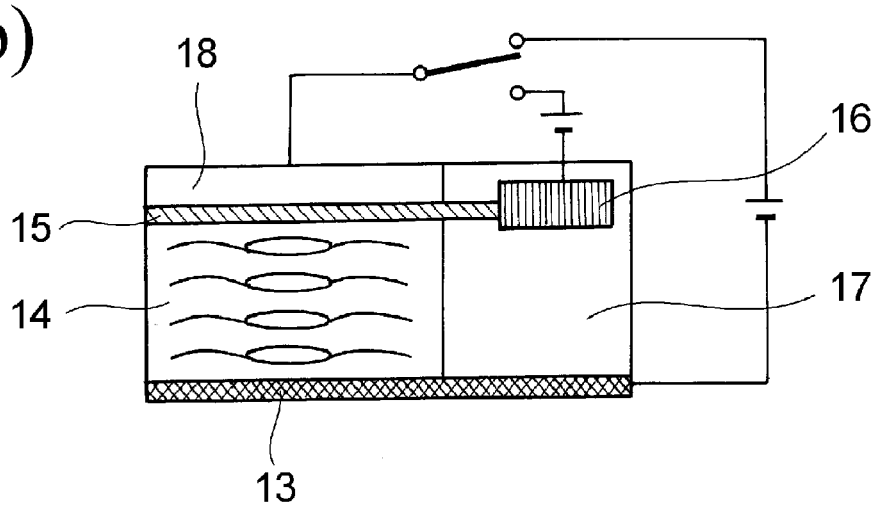

The smectic liquid crystal state of the electroconductive liquid crystal compound in the memory cell 14 is reversible. Therefore, the written information can be erased as follows. As shown in FIG. 10(a), a voltage is applied between the second electrode 16 and the third electrode 18 to drive the heater 15 to re-heat the memory cell 14 to or above the temperature at which a smectic liquid crystal phase is exhibited. Then, as shown in FIG. 10(b), the molecules are aligned perpendicular to the electrodes or the molecular alignment is disturbed by applying a voltage above the threshold voltage or applying a magnetic field in the vertical direction and so on, between the first electrode 13 and the third electrode 18. As a result, the memory cell 14 exhibits low electroconductivity and low optical anisotropy, thereby the information is erased. Rewrite is carried out by applying a voltage between the second electrode 16 and the third electrode 18 to drive the heater 15 thereby to heat the memory cell 14.

The memory device 10 according to the present embodiment is preferably produced through the following steps (A1) to (A6) for example.

(A1) A wire pattern of first electrodes 13 is formed on a lower substrate 11 by photolithography.

(A2) A low resistance metal is deposited as a metal wire by vacuum evaporation or sputtering to form first electrodes 13.

(A3) A pattern of an insulator 17 is formed by photolithography, and an insulator 17 is formed by applying an insulating material by, for example spin coating.

(A4) A thin film of a liquid crystal compound is formed on the predetermined portions of the metal wire as the first electrodes 13 by vacuum evaporation or spin coating to form memory cells 14.

(A5) A thin film of a metal for heating is formed on the predetermined portions of the memory cells 14 by vacuum evaporation or sputtering to form heaters 15.

(A6) A thin film of a metal wire is deposited in a prescribed pattern by vacuum evaporation or sputtering to form second electrodes 16 and third electrodes 18.

In carrying out the above steps, the same photolithographic technique as used in the IC manufacturing can be used.

Figure 11:
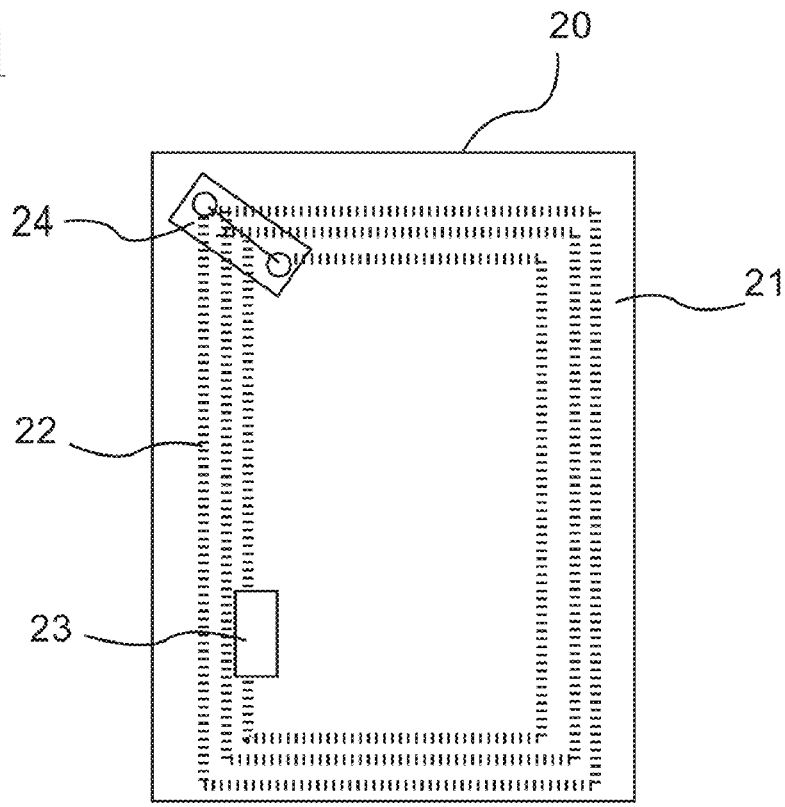
FIG. 11 is a schematic plan of an exemplary embodiment of the IC tag according to the invention.

The IC tag according to the present invention will then be described. The IC tag of the invention is characterized by using the memory device of the invention. The IC tag of the invention will be described with reference to FIG. 11. FIG. 11 is a plan of an exemplary embodiment of the IC tag of the invention.

As illustrated in FIG. 11, an IC tag 20 includes a plastic substrate 21 of film form, an antenna 22 provided on the plastic substrate 21, and an integrated circuit 23 provided on the plastic substrate 21. An insulating layer 24 is provided to cover the two ends of the antenna wire of the antenna 22. A jumper is provided in such a manner that the jumper bridges the two ends of the antenna wire over the insulating layer 24 to electrically connect the antenna wires. The memory device of the invention is mounted on the integrated circuit 23. The IC tag may further have a protective film on its surface. The back side of the IC tag 20 may be made pressure-adhesive so that the tag may be stuck to an article with a curved surface such as a bag of sweets or a beverage can.

The material making the plastic substrate film 21 is not particularly limited, and resins generally used in IC cards and IC tags can be used. Examples of such resins include those recited with respect to the material of the lower substrate 11.

Any conductive material can be used to make the antenna 22. Examples of such materials include those recited with respect to the material of the first to third electrodes.

The antenna 22 can be formed by known techniques. Printing techniques such as screen printing, offset printing, gravure printing, and inkjet printing are preferred. If desired, a binder resin may be incorporated to a conductive paste to be printed to improve adhesion to the substrate.

After the antenna 22 is formed, the integrated circuit 23 having the memory device of the invention is mounted to produce an IC tag. Known adhesive materials can be used to connect the integrated circuit 23 and the antenna 22, including anisotropic conductive film, anisotropic conductive paste, and insulating paste. The adhesive material can be applied by, for example, a dispenser method or printing.

The following is an example of the production of the IC tag 20 shown in FIG. 11. The memory device used in this example can be produced in accordance with the above described method of producing the memory device 10.

Example for Production of IC Tag 20:
(1) A commercially available conductive paste consisting of 75 wt % of silver, 15 wt % of a binder resin, and 10 wt % of a solvent was screen printed on a polyethylene terephthalate substrate 21 in a loop antenna pattern, preliminarily dried at 50° C. for 20 minutes, and baked at 150° C. for 30 minutes to form an antenna 22.
(2) A commercially available insulating paste was printed twice to a portion where a jumper is to be formed. The same conductive paste as used to form the antenna was screen printed on the resulting insulating layer to form a jumper.
(3) A memory device 10 and a signal circuit IC (not shown) are mounted on the ends of the antenna as the integrated circuit 23 via anisotropic conductive film (adhesive tape) to make an IC tag 20.

While the invention has been described with particular reference to the memory device and IC tag incorporating one embodiment of the invention, the invention is not construed as being limited thereto. For example, the configuration of the antenna and integrated circuit in the IC tag is designed arbitrarily. It is possible to incorporate a logic circuit such as a signal processing IC into the IC tag.

EXAMPLES

The present invention will now be illustrated in greater detail with reference to Examples, but it should be understood that the invention is not deemed to be limited thereto.

Synthesis Examples for the preparation of styryl derivatives used to form the memory cells of the memory device are described first.

Synthesis Example 1

Styryl Derivative (A)

Synthesis of
1,4-Bis(4'-pentadecanoxystyryl)benzene-(E,E)

(1) p-Pentadecanoxybenzaldehyde was prepared by the steps described below in accordance with the following reaction scheme.

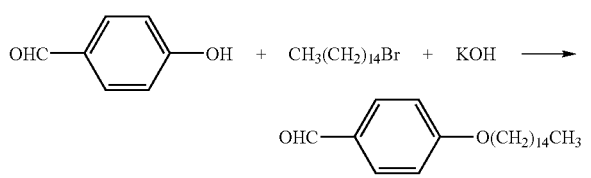

In a 100 ml four-necked flask, 2.79 g (42.3 mM) of 85 wt % potassium hydroxide was suspended in 30 ml of dimethylformamide, and 10 ml of a dimethylformamide solution containing 5.28 g (43.2 mM) of hydroxybenzaldehyde was added thereto dropwise while maintaining the system at 20° C. or lower, followed by aging at 30° C. for 1 hour. To the system was added 9.58 g (32.9 mM) of 1-bromopentadecane, followed by aging at 70° C. for 21 hours. The reaction mixture was dispersed in water and extracted with toluene. The extract was washed with water and concentrated to give 11.03 g of a slightly colored viscous liquid. Recrystallization from hexane gave 8.91 g of p-pentadecanoxybenzaldehyde (purity: 98.3%).

(2) A 1,4-bis(4'-pentadecanoxystyryl)benzene isomeric mixture (compound (1a)) was prepared by the steps described below in accordance with the following reaction scheme.

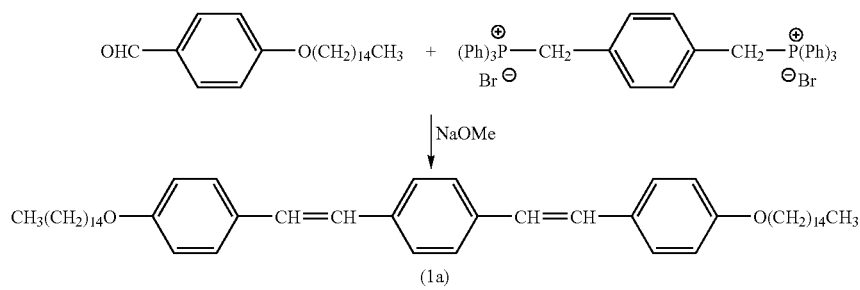

In a 30 ml four-necked flask, 7.87 g (23.7 mM) of the p-pentadecanoxybenzaldehyde synthesized above and 8.65 g (11.0 mM) of p-xylylenebis(triphenylphosphonium bromide) were suspended in 100 ml of methanol, and 6.87 g (35.6 mM) of 28 wt % methylate was added thereto dropwise at room temperature (25° C.). The mixture was aged at a refluxing temperature of 65° C. for 3 hours. Methanol was removed by evaporation, and 200 ml of water was added to the residue, followed by stirring. The precipitate thus formed was collected by filtration, washed with water and acetone, and dried to give 7.49 g of a 1,4-bis(4'-pentadecanoxystyryl)benzene isomeric mixture (compound (1a)). The $^1$H-NMR data for identification were as follows.

$^1$H-NMR: 7.45 ppm (4H, s), 7.42 (4H, d), 7.06 (2H, d), 6.94 (2H, d), 6.88 (4H, d), 3.96 (4H, t), 1.78 (4H, m), 1.2-1.5 (48H, m), 0.87 (6H, t)

(3) 1,4-Bis(4'-pentadecanoxystyryl)benzene-(E,E) was prepared as follows.

In a 100 ml egg flask, 7.49 g (10.2 mM) of the 1,4-bis(4'-pentadecanoxystyryl)benzene isomeric mixture synthesized above and 20 mg (0.08 mM) of iodine were suspended in 50 ml of p-xylene, followed by aging under reflux at 139° C. for 8 hours. After completion of the reaction, the precipitate formed was collected by filtration and dried to yield 7.06 g (purity: 99.9%) of 1,4-bis(4'-pentadecanoxystyryl)benzene-(E,E). The $^1$H-NMR data for identification were as follows.

$^1$H-NMR: 7.45 ppm (4H, s), 7.42 (4H, d), 7.06 (2H, d), 6.94 (2H, d), 6.88 (4H, d), 3.96 (4H, t), 1.78 (4H, m), 1.2-1.5 (48H, m), 0.87 (6H, t)

Synthesis Example 2

Styryl Derivative (B)

Synthesis of
1,4-Bis(4'-decanoxystyryl)benzene-(E,E)

The procedures of Synthesis Example 1 were repeated except for replacing 1-bromopentadecane with 1-bromodecane to yield 3.43 g (purity: 99.9%) of 1,4-bis(4'-decanoxystyryl)benzene-(E,E) represented by general formula (1b). The $^1$H-NMR data for identification are shown below.

$^1$H-NMR: 7.45 ppm (4H, s), 7.43 (4H, d), 7.06 (2H, d), 6.94 (2H, d), 6.87 (4H, d), 3.98 (4H, t), 1.77 (4H, m), 1.2-1.5 (28H, m), 0.88 (6H, t).

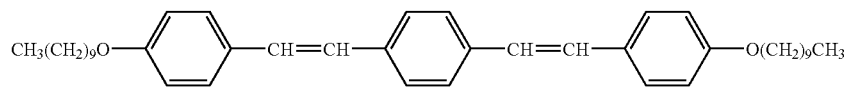

(1b)

The styryl derivatives obtained in Synthesis Examples 1 and 2 were found to exhibit the phase transitions shown in Table 1 below from the textures of the liquid crystal phase appeared in a polarizing microscope.

TABLE 1

|  | Phase Transition (° C.) |
| --- | --- |
| Synthesis Example 1 | C 138 SmG 170 SmF 226 SmC 308 N 310 I |
| Synthesis Example 2 | C  98 SmG 187 SmF 250 SmC 255 N 270 I |

C: crystal; SmG: smectic G phase; SmF: smectic F phase; SmC: smectic C phase; N: nematic phase; I: isotropic liquid Evaluation of Electroconductive Liquid Crystal Layer:

(1-1)

Four glass substrates having an ITO electrode (2×2 mm, 0.7 mm thickness) were prepared. Each of the glass substrates was coated with poly(3,4-ethylenedioxy-thiophene)-polystyrene sulfonate (hereinafter abbreviated as PEDOT-PSS) by spin coating. The unnecessary portion of the PEDOT-PSS was removed with isopropyl alcohol, and the PEDOT-PSS was cured by heating at 200° C. for 30 minutes to form a PEDOT-PSS layer (thickness: 0.1 µm). The substrate with the PEDOT-PSS layer was set in a vacuum evaporation system, and 40 mg of an equimolar mixture of the styryl derivatives obtained in Synthesis Examples 1 and 2 (evaporation material) was put in the boat of the vacuum chamber. The distance between the substrate and the evaporation material was 12 cm. Electrical current was applied to the boat to carry out vacuum deposition while monitoring the state of evaporation by means of a vacuometer. After completion of the vacuum deposition, nitrogen gas having passed through a desiccant bed was introduced into the vacuum chamber to atmospheric pressure. An electroconductive liquid crystal layer of the styryl derivatives having a thickness of 300 nm was thus formed.

The phase transitions of the resulting layer of the mixed electroconductive liquid crystal semiconductor (compounds of Synthesis Examples 1 and 2) is shown below.

TABLE 2

|  | Phase Transfer (° C.) |
| --- | --- |
| Liquid Crystal Composition | C 90 SmG 120 SmF 210 SmC 225 N 231 I |

Figure 12:
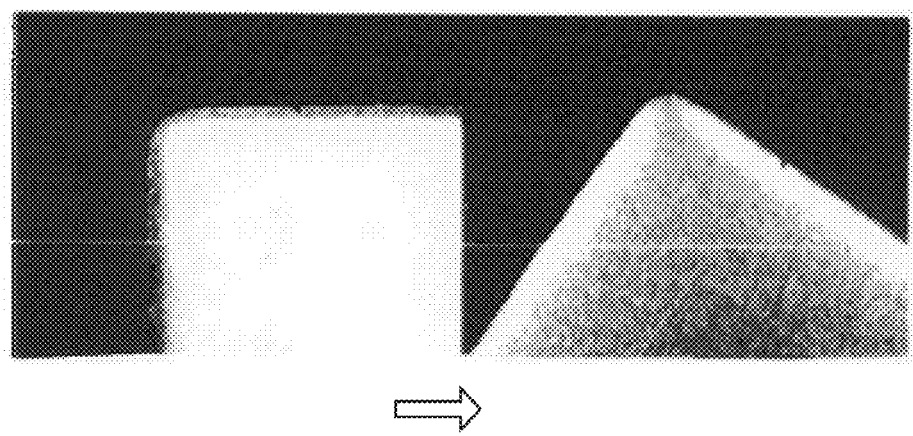
FIG. 12 presents polarizing micrographs of the electroconductive liquid crystal layer prepared in Example that is in a solid state after being heated at 150° C. for 3 minutes followed by being allowed to cool spontaneously to room temperature (25° C.), the micrographs providing the confirmation that the liquid crystal molecules are aligned homogeneously with respect to the substrate.
Figure 13:
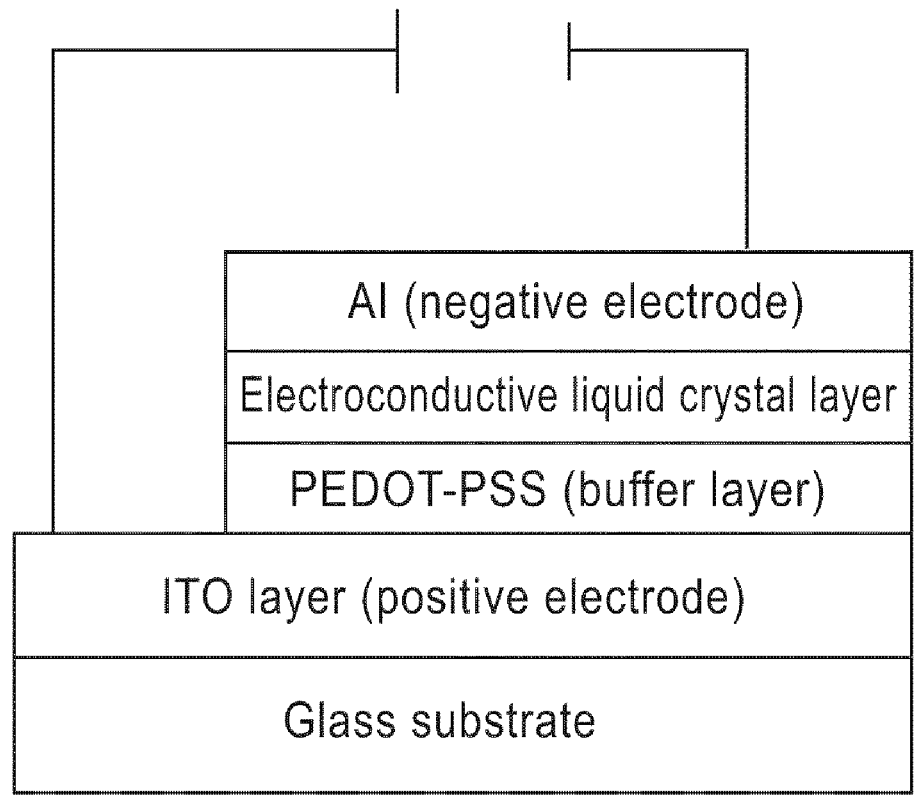
FIG. 13 is a schematic diagram of the device used to evaluate the electroconductivity (voltage vs. current) of the liquid crystal layer prepared in Example.
Figure 14:
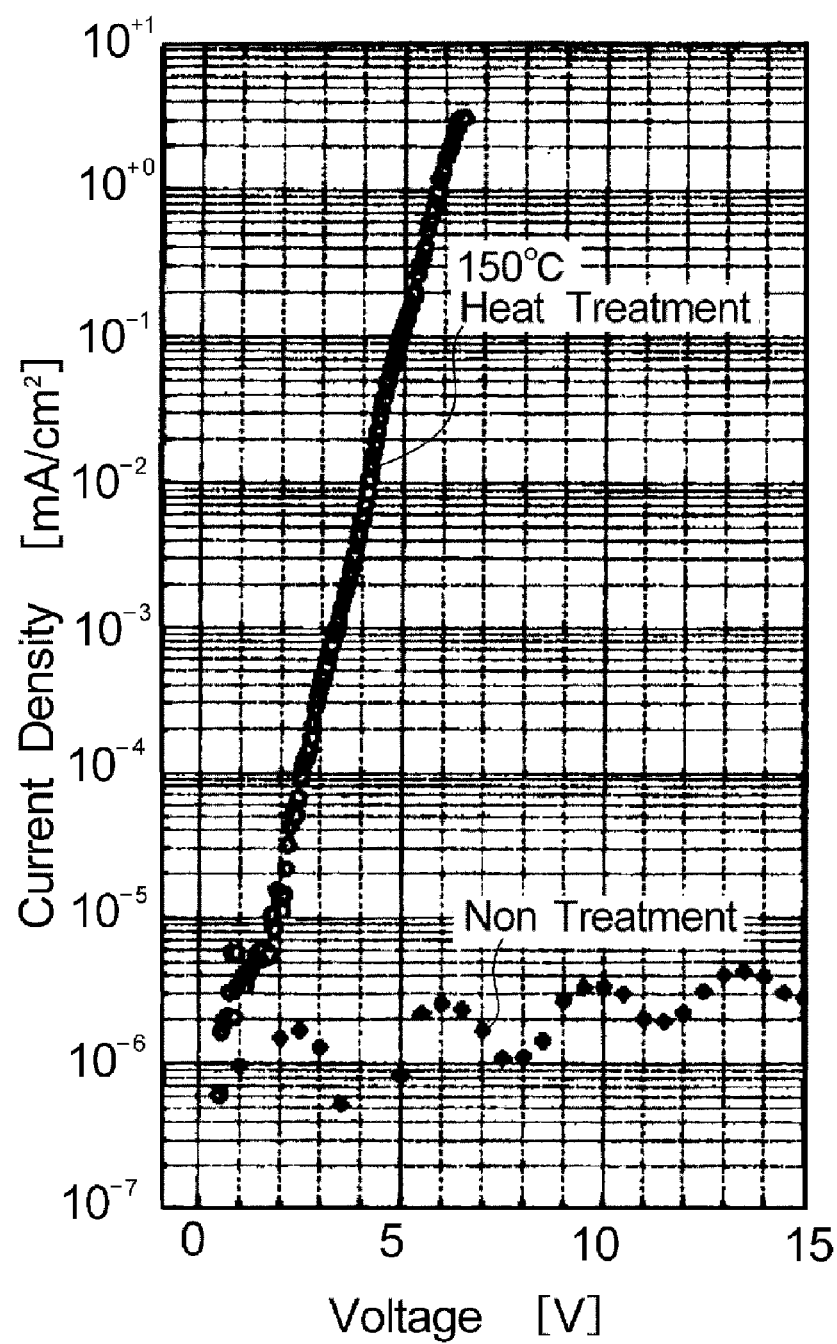
FIG. 14 is a graph showing the voltage vs. current relationship of the liquid crystal layer prepared in Example and heat-treated to form a smectic liquid crystal phase, followed by cooling spontaneously to convert the liquid crystal phase into a solid phase and the voltage vs. current relationship of the same liquid crystal layer not having been heat treated.

C: crystal; SmG: smectic G phase; SmF: smectic F phase; SmC: smectic C phase; N: nematic phase; I: isotropic liquid The four substrates prepared in (1-1) gave a dark field image under a polarizing microscope. Two out of the four substrates were again set on the vacuum evaporation system and heated at 150° C. for 3 minutes in a nitrogen atmosphere to develop a smectic liquid crystal phase. The substrates were taken out of the vacuum chamber and observed at room temperature under a polarizing microscope. A bright field image was observed as shown in FIG. 12. The four substrates prepared in (1-1) were again set on the vacuum evaporation system, and aluminum was evaporation deposited on the electroconductive liquid crystal layer of the styryl derivatives (thickness: 300 nm) to form an aluminum electrode. The device illustrated in FIG. 13, which was designed for evaluating the electroconductivity of the liquid crystal layer (current vs. applied voltage), was thus prepared. A positive voltage was applied to the ITO electrode, and a negative voltage was applied to the aluminum electrode, and the amount of the current passing the device was measured for every rise of the voltage. As a result, the devices having been heat treated at 150° C. to have a smectic phase exhibited 1,000,000 times as high electroconductivity at a voltage of 6 V as the devices not having been heat treated (see FIG. 14). These results prove that the smectic liquid crystal molecular alignment formed in the devices having been heat treated is maintained even after cooling to room temperature, and the devices having been heat treated exhibit electroconductivity and optical anisotropy. In contrast, the devices not having been heat treated have a random molecular orientation, are electrically insulating, and exhibit no optical anisotropy. It has now been confirmed that selective heating produces a contrast between an electroconductive state and an electrically nonconductive state and a difference in optical anisotropy.

(2-1)

Four glass substrates having an ITO electrode (2×2 mm, 0.7 mm thickness) were prepared. Each of the glass substrates was coated with PEDOT-PSS by spin coating. The unnecessary portion of the PEDOT-PSS was removed with isopropyl alcohol, and the PEDOT-PSS was cured by heating at 200° C. for 30 minutes to form a PEDOT-PSS layer (thickness: 0.1 µm). The substrate with the PEDOT-PSS layer was set in a vacuum evaporation system, and 40 mg of an equimolar mixture of the styryl derivatives obtained in Synthesis Examples 1 and 2 (evaporation material) was put in the boat of the system. The angle of deposition was 45°, and the distance between the substrate and the evaporation material was 12 cm. Electrical current was applied to the boat to carry out vacuum deposition while monitoring the state of evaporation by means of a vacuometer. After completion of the vacuum deposition, nitrogen gas having passed through a desiccant bed was introduced into the vacuum chamber to atmospheric pressure. An electroconductive liquid crystal layer of the styryl derivatives having a thickness of 300 nm was thus formed. The substrate was then heated at 150° C. for 3 minutes in a nitrogen atmosphere in the vacuum evaporation system to cause the liquid crystal layer to exhibit a smectic liquid crystal phase. The molecular long axis direction of the liquid crystal material was confirmed by a polarizing microscope. When a polarizing plate was placed with its transmission axis coincident with the molecular long axis, and the device was irradiated with nonpolarized ultraviolet light, blue polarized light having passed through the polarizing plate was observed (see FIG. 15(a)). When the transmission axis of the polarizing plate was then turned 90°, and nonpolarized ultraviolet light was shined on the device, there was observed no blue polarized light having passed through the polarizing plate (see FIG. 15(b)). Light polarized in the direction indicated by the two-headed arrow in FIG. 15(a) was emitted from the liquid crystal layer, and it can be read with a polarizing plate having its transmission axis coincident with the polarization direction. Accordingly, the difference in molecular long axis direction of the liquid crystal semiconductor material can be taken advantage of in achieving multiplex writing, and each piece of written information can be read by aligning the angle of the transmission axis of the polarizer with the molecular long axis (see FIG. 16).

As described, since the memory device according to the present invention is capable of writing information simply by operating the heater, it has a simple structure. Therefore, the products from the memory device to the IC tag can be manufactured through simple processing steps.

What is claimed is:

1. A memory device for storing information which comprises:
    a plurality of first electrodes extending in one direction in parallel relation with each other,
    a plurality of memory cells containing an electroconductive liquid crystal compound having a long linear conjugate structure and exhibiting a smectic phase as a liquid crystal phase, the memory cells being provided on each of the first electrodes discretely at a prescribed spacing in such an arrangement as to form a plurality of straight lines extending in the extending direction of the first electrodes and to form a plurality of straight lines extending in the direction which crosses the extending direction of the first electrodes,
    a plurality of heaters each provided on each of the memory cells and adapted to heat the memory cells,
    a plurality of second electrodes extending in one direction in parallel with each other, and crossing the first electrodes, the second electrodes being located at a side portion of the heaters which are arranged in a straight line along the extending direction of the second electrodes and being connected to the heaters, and
    a plurality of third electrodes extending in the same direction as the second electrodes in parallel relation with each other, and third electrodes being provided on a plurality of the heaters arranged in a straight line along the extending direction of the third electrodes, and being connected to the heaters,
    the storing information being carried out by making use of the molecular alignment of the liquid crystal compound in its liquid crystal phase formed by selectively heating the memory cells.

2. The memory device according to claim 1, wherein the liquid crystal compound is a styryl derivative represented by general formula (1):

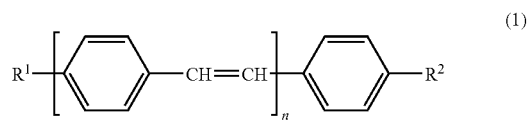

wherein $R^1$ and $R^2$, which may be the same or different, each represent a straight-chain or branched alkyl group, a straight-chain or branched alkoxy group, a cyano group, a nitro group, F, —C(O)O(CH$_2$)$_m$—CH$_3$, —C(O)—(CH$_2$)$_m$—CH$_3$, or general formula (2) below; and n represents an integer of 2 to 3;

wherein $R^3$ represents a hydrogen atom or a methyl group; B represents —(CH$_2$)$_m$—, —(CH$_2$)$_m$—O—, —CO—O—(CH$_2$)$_m$—, —C$_6$H$_4$—CH$_2$—O— or —CO—; and m represents an integer of 1 to 18.

3. A data writing method using the memory device according to claim 1, comprising applying a voltage between the second electrode and the third electrode to selectively drive the heater thereby to selectively heat the memory cell containing the electroconductive liquid crystal compound in a state with no liquid crystal molecular alignment to cause the electroconductive liquid crystal compound to form a molecular alignment of the liquid crystal phase, whereupon the heated memory cell simultaneously gains both electroconductivity and optical anisotropy.

4. The data writing method according to claim 3, wherein the memory cells contain at least an electroconductive liquid crystal compound having positive dielectric anisotropy and positive magnetic susceptibility, and
    the electroconductive liquid crystal compound is caused to form a homogeneous or homeotropic liquid crystal alignment, whereupon the selected memory cell simultaneously gains both electroconductivity and optical anisotropy.

5. A data writing method using the memory device according to claim 1, comprising applying a voltage between the second electrode and the third electrode to drive the heater thereby to heat the memory cell containing the electroconductive liquid crystal compound in a state having a liquid crystal molecular alignment perpendicular to the electrodes or in a state having random liquid crystal molecular orientation and applying an electric field or a magnetic field to the heated memory cell to cause the electroconductive liquid crystal compound to form molecular alignment of the liquid crystal phase to form a spot emitting fluorescence polarized in the molecular long axis direction of the electroconductive liquid crystal compound, thereby to achieve optical multiplex writing in the same spot.

6. A data reading method for reading data written by the data writing method of claim 5, comprising irradiating the memory cell emitting fluorescence polarized in the molecular long axis direction of the electroconductive liquid crystal compound with exciting light, and aligning the transmission axis of a polarizing plate with the oscillation direction of the polarized fluorescence.

7. An IC tag comprising the memory device according to claim 1.

* * * * *